United States Patent [19]

Fierkens et al.

[11] Patent Number: 4,553,420
[45] Date of Patent: Nov. 19, 1985

[54] METHOD AND APPARATUS FOR TOUCH-FREE LEAD BENDING

[75] Inventors: Richardus H. J. Fierkens, Herwen; Ireneus J. T. M. Pas, Rozendaal, both of Netherlands

[73] Assignee: ASM Fico Tooling, b.v., Herwen, Netherlands

[21] Appl. No.: 537,681

[22] Filed: Sep. 30, 1983

[51] Int. Cl.⁴ .............................................. B21D 5/02
[52] U.S. Cl. ...................................... 72/380; 29/827; 140/105
[58] Field of Search ................. 72/380, 381, 382, 386, 72/465, 293, 312, 313; 140/105; 29/827, 884, 882

[56] References Cited

U.S. PATENT DOCUMENTS 2,681,682 6/1954 Larkin ................................. 72/380

FOREIGN PATENT DOCUMENTS 761081 9/1980 U.S.S.R. .............................. 140/105

Primary Examiner—Francis S. Husar
Assistant Examiner—Linda McLaughlin
Attorney, Agent, or Firm—Weiss & Holloway

[57] ABSTRACT

Apparatus is provided for bending one or two complete rows of leads on a dual-in-line semiconductor package at one time without damaging the leads. The leads of the dual-in-line package are initially in their manufactured position, extending horizontally from the sides of the package and generally parallel to the top and bottom surface thereof. A support anvil is placed under the portion of the lead which is sealed in the semiconductor package, and a punch or bending member is disposed immediately adjacent the outside edge of the handle for performing the actual bending. A sheet of relatively thin metal is formed into a U-shaped channel and the bending member inserted therein before lowering so that as the bending member is lowered, no portion thereof touches the surface of the leads being bent. The sheet of thin metal buffers the bending operation and is interposed between the bottom and side of the bending member and the face of the leads for preventing scratching or damage thereto. At the end of the downward movement of the bending member, the row of leads is substantially nearly vertical and the anvil, sheet of metal and punch may be removed for the next successive dual-in-line package. For two row operation, both the anvil and the punch include die portions for bending the leads and the steel sheets are wound and unwound for protecting the leads being bent. A method of bending is also provided using a punch partially covered with a thin sheet of steel.

20 Claims, 7 Drawing Figures

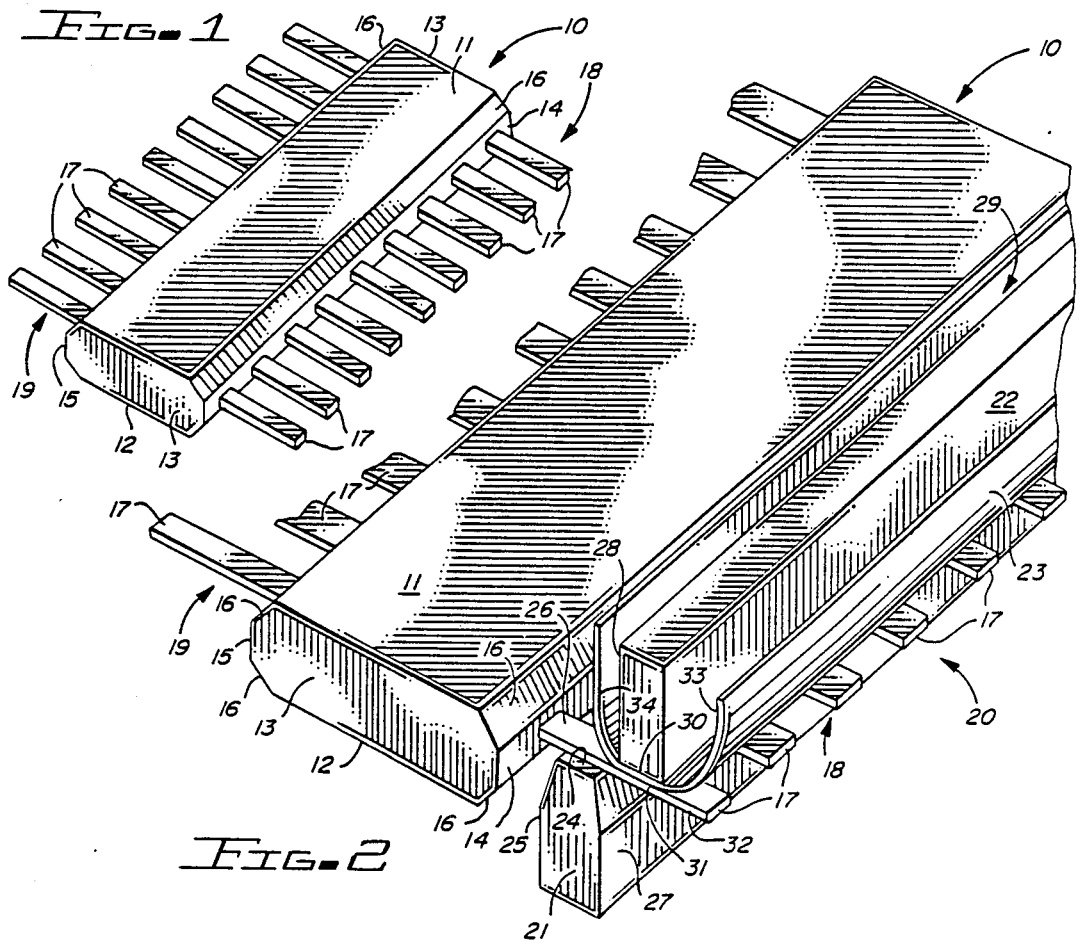
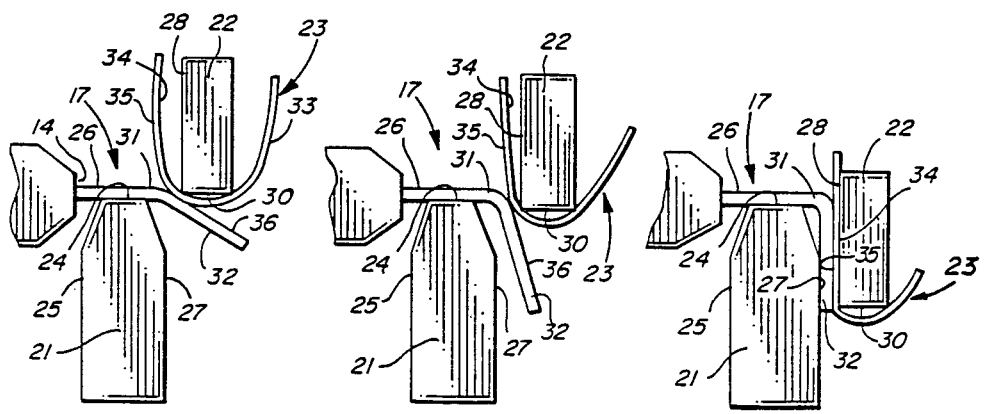

METHOD AND APPARATUS FOR TOUCH-FREE LEAD BENDING

BACKGROUND OF THE INVENTION

1. Field of the Invention

This invention relates to a method and apparatus for bending leads on a dual-in-line semiconductor package and more particularly to a method and apparatus for bending a complete row of leads and preferably both rows of leads on a semiconductor dual-in-line dual-in-line package without scratching or otherwise damaging the surface of the leads.

2. Description of the Prior Art

The prior art pins teach various ways for bending leads or pins on semiconductor packages and while some teach bending individual leads, more recent systems teach a method and apparatus for bending all the leads on one side or both sides of the semiconductor package at a single stroke.

The bending apparatus of the prior art involved means for positioning an anvil-type member beneath the base of the leads or pins and then lowering a punch member onto the top of the leads or pins to bend them about the anvil, and at times to slide roughly against the surface of the portion of the lead being bent causing scratches, scoring, marking, breaking, and other damage.

No effective solution to the problem of damaging or scratching the lead surfaces during the bending operation has previously been attained, and since damage to a single lead often causes a multiple-lead, dual-in-line dual-in-line semiconductor package to be rejected, the reduced yield of the prior art methods is both expensive and results in customer dissatisfaction and the like.

Although different shapes of anvils, punches, and variations in spacing distances between the forming side of the anvil and the operative side of the punch have been made, no one has solved the scratching and marring problem. Further, even when less leads or pins are bent during a single operation, damage still results but, of course, yield is even more greatly diminished.

The method and apparatus for bending dual-in-line package leads of the present invention solves substantially all of these problems and provides a relatively low cost, extremely simple means whereby one or both entire rows of leads of a semiconductor package can be bent without scratching or in any way damaging the leads, thereby increasing production, yield, reliability, and customer satisfaction.

SUMMARY OF THE INVENTION

The present invention provides a method an apparatus for bending a plurality of leads in at least one row of a multiple pin dual-in-line semiconductor package wherein the leads are originally oriented outward from the package and substantially parallel to the top and bottom sides after the original manufacturing operation, and bent radially downward to a substantially nearly vertical position approximately normal to the plane of the semiconductor package faces to enable the leads to be inserted into electrical pin sockets and the like.

The bending apparatus of the present invention includes a stationary anvil means extending at least along the entire length of a row of leads and operatively disposed under the leads and proximate the end portions thereof which are sealed into said package for preventing the leads from breaking off during the bending operation. The anvil has its working end positioned substantially immediately adjacent the side of said semiconductor package with that portion of the base of the lead which is not to be bent extending across its working surface to be bent as hereinafter described.

A vertically movable or reciprocating bending member having its working end portion operably disposed along at least the entire length of a row of leads outward of the said stationary anvil means and substantially immediately adjacent the outer surface thereof, said vertically movable bending member being disposed immediately above the top surface of said lead to be bent for bending same when vertical downward movement begins.

A relatively thin U-shaped sheet of buffer means or material, such as a thin sheet of steel, or stainless steel, or plastic or fabric or the like is folded around the working end portion of said vertically movable bending member along the entire length thereof. The buffer member protects the top surface of the pins or leads from scratching and other damage which might result when the bending member descends to bend the leads against the anvil, since slippage therebetween causes scratching, marking, marring, and other damage to the leads, rendering them unusable. However, the buffer means is the only member touching the leads themselves, and if the vertically moving bending member contacts or slides across the surface of the buffer member, then the only slipping or scratching occurs on the top surface thereof, leaving the leads untouched by the bending member during the operation.

The buffer member will usually also slide under the working surface portion of the bending member to constantly lay down a layer of buffer material between the top surface of the leads and the movable bending member, and since this can result in a reduction of scratching or slipping on the outside surface of the bending member, it can also prevent, or at least reduce, slippage of the inside portion of the buffer means along the top surface of the leads to further reduce the chances of scratches or other damage to the leads being bent.

The invention also contemplates a method of bending the leads in a multi-lead semiconductor dual-in-line package having at least one row of leads extending substantially parallel to the surface of the semiconductor package, it being required that they be bent substantially nearly vertical to the plane of the package for use in circuits and the like. The method contemplates supporting the base portion of a row of leads proximate the end position of each which is disposed in said package and forming a U-shaped channel having a length at least equal to the length of the row of leads from a smooth thin sheet of metal. A bending member is then vertically positioned and inserted within the U-shaped channel and lowered with said surrounding metal sheet to operatively engage the top surface of the horizontal leads immediately adjacent the supported bases. The bending of the row of leads from the horizontal position to the substantially nearly vertical position without said bending means touching the leads so that the only sliding of the bending means is on the surface of the thin steel sheet to substantially eliminate scratching, marking, or other damage to said leads.

The sliding of the metal sheet over the upper surface of the pins is such that the sheet, at least partially, slides off of the end of the bending member and is placed between the bending member and the top surface of the pins substantially along the length of the bend to reduce any sliding of the metal sheet across the lead surface to further minimize scratching and other lead damage and the like. Alternately, both sides of a dual-in-line package can have its row of leads done simultaneously, or less than a full row can be done at one time, if desired. While various materials can be used for the buffer means, a single sheet of steel or stainless steel is contemplated in the preferred embodiment of the present invention, and the preferred thickness of the sheet of steel is approximately 0.002 inches, although various other dimensions may be used, as long as they perform the necessary buffering function.

Other advantages and meritorious features of the present invention will be more fully understood from the following description of the drawings and the preferred embodiment, the appended claims, and the drawings which are described hereinbelow:

BRIEF DESCRIPTION OF THE DRAWINGS

FIG. 1 is a perspective view of an eighteen-pin dual-in-line semiconductor package having its leads in a horizontal position prior to bending;

FIG. 2 is a partial perspective view of the bending apparatus of the present invention illustrating the relative position of the bending apparatus of the present invention;

FIG. 3 is an end view, partially broken away, showing the interrelationship between the stationary and movable members at the beginning of the bending operation;

FIG. 4 is an end view, partially broken away, showing the relative position of the bending apparatus during a further bending of the lead;

FIG. 5 shows the final bending stage just before the bending member or punch is raised to release the bend lead;

DETAILED DESCRIPTION OF THE PREFERRED EMBODIMENT

Figure 7:
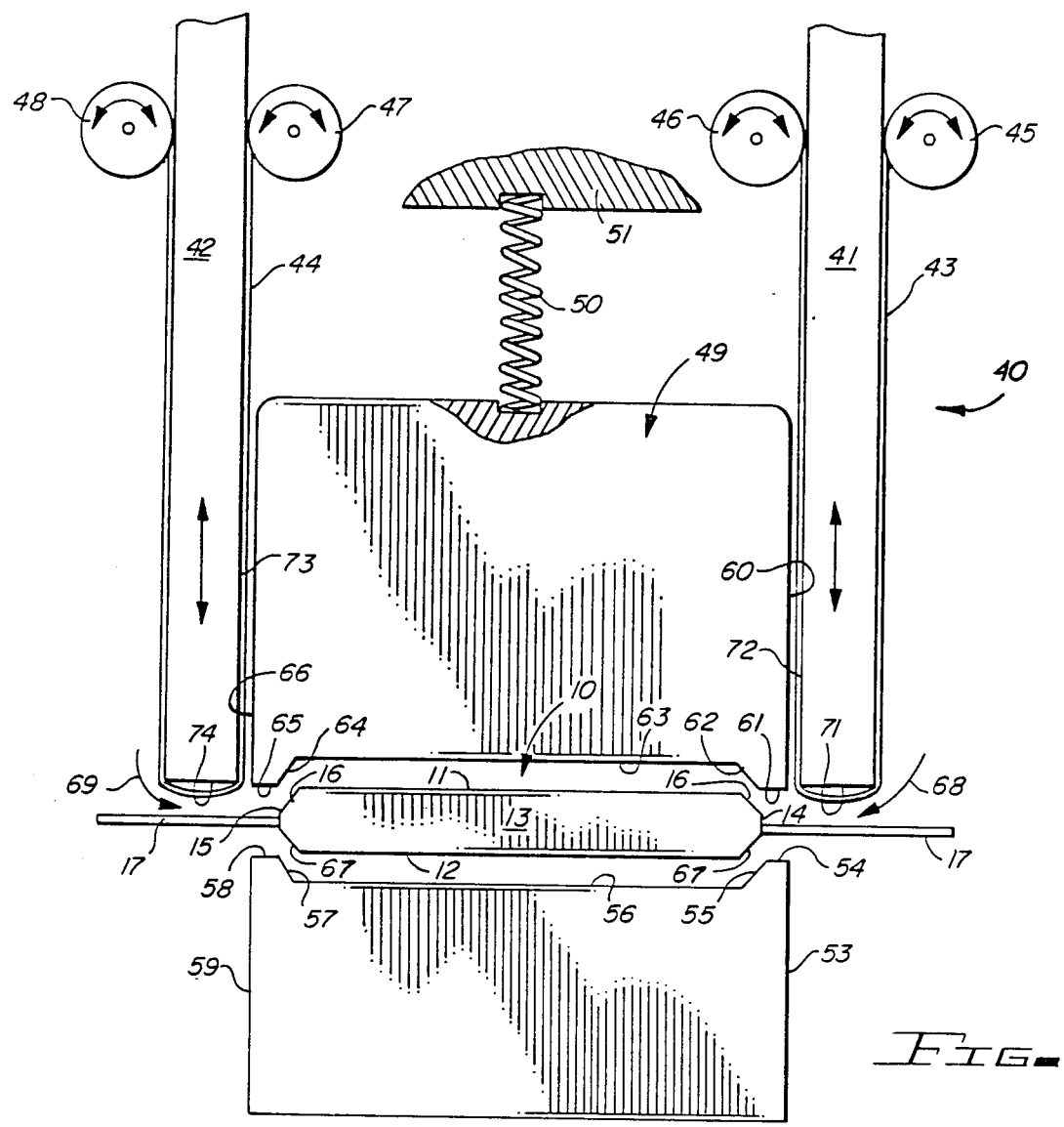
FIG. 7 is a front end view of an alternate embodiment of the lead-bending apparatus of the present invention whereby both longitudinal side rows of leads are bent simultaneously.

FIG. 1 shows a conventional semiconductor package 10 having a generally rectangular shape and a substantially flat upper surface 11, a substantially flat lower surface 12, the upper surface 11 and lower surface 12 are generally parallel to one another and a plane midway therebetween is herein referred to as the plane of the package 10. Furthermore, the package 10 has substantially flat ends 13 and relatively flat longitudinal side portions 14 and 15 which are generally perpendicular to the plane of the surfaces 11, 12. The portion between the upper surface 11 and the edge surfaces 14 and 15 may be tapered or sloped 16, as may be the surface 16 between the edge portions 14 and 15 and the bottom 12. The tapered portions are represented by the reference numeral 16, although the semiconductor package 10 need not include the tapered portions 16. A plurality of leads or pins 17 are aligned along each of the sides 14 and 15. In the present example, the package 10 is an eighteen pin or eighteen lead dual-in-line semiconductor package. A first row 18 of nine leads 17 is operably disposed along the edge 14 which is substantially perpendicular to the upper and lower surfaces 11 and 12 and the leads 17 are equally spaced along the edge 14 and are disposed with one end operably sealed into the package 10 and its opposite end extending horizontally outward from the edge 14, 15, substantially horizontal to the plane of the upper surface 11 and lower surface 12.

The dual-in-line package of FIG. 1 represents the semiconductor package 10 in its manufactured state with the leads 17 extending outward in the horizontal position prior to bending. However, the leads 17 must be bent downward before the semiconductor circuit within the package can be used, since they are plugged into sockets and the like to incorporate the circuit of the package 10 into a printed circuit board or the like. It will be understood that the particular semiconductor package 10 of FIG. 1 could be a conventional dual-in-line welded-seal package, side-braised packaged, ceramic package, plastic package, frit-sealed package, lead-molded dual-in-line package, glass/metal dual-in-line package, lead cavity dual-in-line package, a mini-dual-in-line package, and the like. Any semiconductor package 10 with one or more rows of leads or pins 17 which are manufactured in the horizontal position substantially parallel to the plane of the package 10 and which must be vertically positioned for engaging sockets receptacles, pin connectors, and the like for use as may be required with the present invention.

FIG. 2 shows a broken away perspective view of the eighteen pin dual-in-line package 10 of FIG. 1, positioned to have the leads 17 on one side 18 bent to the proper substantially nearly vertical downward position. The bending apparatus 20 of FIG. 2 includes an anvil or support member 21, a vertically positionable punch or bending member 22, and a sheet of buffer material or metal 23 such as stainless steel or the like. In the preferred embodiment, the upper end or face 24 of the anvil 21 is positioned under the bottom surface of the leads 17 and the row 18 so that its left side 25 is proximate the edge 14 and immediately adjacent thereto for supporting the shoulder portion or base plane 26 upon the generally flat anvil face or top 24. The outer side surface 27 of the anvil 21 is the surface over which the leads 17 are bent by the downward movement of the punch 22, as hereinafter described.

The punch or bending member 22 is operably disposed above the top surface of the leads 17 of the first row 18, so that an inside surface 28 of the member 22 will be immediately adjacent an outside surface 27 of the anvil 21 when the bending member 22 moves downward with sufficient distance therebetween to accommodate the relatively thin sheet of metal 23. The metal sheet 23, such as stainless steel or steel, has a very thin dimension, for example 0.002 inches, and is formed into a U-shaped channel with an open end 29 disposed upwardly for receiving the punch 22 with the working surface 28 disposed toward the semiconductor package 10 and the working face or tip 30 disposed in the base of the U-shaped buffer member 23 and operably disposed over the top surface of the leads 17 proximate the bending portion or seating plane for bending about the bending point or portion 31 to vertically lower the socket-engaging lead tip or gauge plane portion 32 of leads 17, as hereinafter described. The opposite side 33 of the U-shaped channel is proximate the distal ends of the leads 17.

The sheet 23 may (see, for example, FIG. 7) or may not be held in place against the punch 22 before the bending process. Also, the sheet 23 may be held in place by a clamp or any other suitable means before the bending process. In addition, the sheet 23 may be drawn off a roll or other feeding means and a new section of it used with each bending operation or a single piece of the sheet 23 may be used repeatedly.

FIG. 3 shows a first step in the bending process. The anvil 21 has been positioned with its upper face portion 24 immediately under and proximate to the base portion or shoulder portion 26 of the leads 17 with the inside edge 25 of the anvil 21 being operably disposed immediately adjacent to the edge portion 14 of the dual-in-line package. The outside or working surface 27 of the anvil 21 is disposed immediately below the bending portion 31 of the leads 17. The bending member or punch 22 has its working face 30 operatively disposed above the bending portion immediately adjacent the working surface 27 of the anvil 21, with sufficient room therebetween to allow for the thickness of the buffer member 23 and the leads 17. As soon as the punch face 30 with the sheet 23 wrapped therearound contacts the bending plane area 31 adjacent the end of the top face 24 and the beginning of the side portion 27 of anvil 21, the bending portion 31 of the lead begins to bend downward. The punch 22, however, does not touch the top surface 36 of the bending portion 31 or socket-engaging end portion 32 of the leads 17. Rather, the thin metal sheet 23, and more particulary the outside surface 35 thereof, contacts the leads 17 during the actual bending operation, and if the punch 22 slides or the like, the sliding will be against the inside surface 34 of the buffer sheet 23 to prevent scratching, scarring, marking, or otherwise damaging the leads of the dual-in-line package being bent.

FIG. 4 illustrates the bending process when the punch member 22 has vertically descended further and the bending portion 31 has bent considerably under the force of the punch face 30 as applied via the protective sheet 23. The sheet not only protects the face of the leads 17 by absorbing any scratching or the like from the punch 22, but the metal sheet 23 is so smooth that it can slide along the face of the leads 17 without damage to same. Additionally, when the bending process continues, the portion of the sheet 33 on the right side of the work face 30 can actually slide to the left so as to virtually lay down a carpet or buffer of the steel sheet 23 in front of the punch face 30 and along the work side 28, thereby even further preventing scratching or other damage to the leads.

FIG. 5 shows punch 22 in its substantially downward vertical position and the sheet of thin metal 23 primarily disposed between the work surface 28 of the punch 22 and the portion of the lead which is bent substantially nearly vertical to the plane of the upper and lower surface 11, 12 of the dual-in-line package 10 to form approximately a ninety degree angle thereto. However, once the punch 22 is raised and anvil 21 and sheet 23 are removed, the lead springs back a slight angle alpha as shown in FIG. 6, but this is no problem since the leads can be bent a small distance for insertion into sockets or the like to combine the integrated circuits contained within the package 10 into printed circuit boards, other circuits, or the like.

It will be understood that, regardless of the method of operation of the buffer means or relatively thin steel sheet, the fact remains that it works and does prevent scratching and other forms of damage and the like to the leads 17 of the semiconductor package 10. It will be understood that while the bending apparatus 20 illustrated in FIG. 2 was shown as bending one entire row of leads 17 at a time, that less than a row can be done at one time, as can two rows, one on either side of the package 10, multiple rows, and the like if desired.

Figure 6:
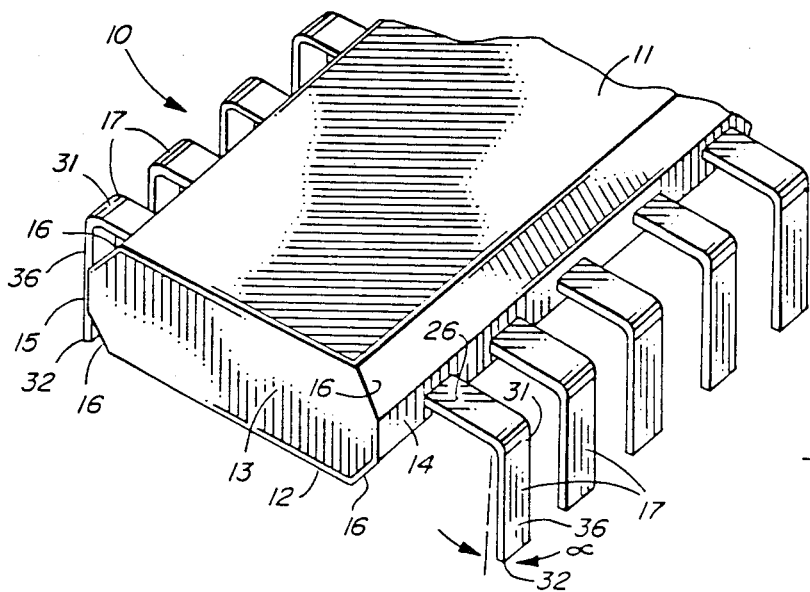
FIG. 6 is a partial perspective view of the semiconductor package of FIG. 1 showing the position of the bent leads after the touch-free bending operation of the present invention is completed.

FIG. 6 shows a perspective end view of the finished product of the bending operation of FIGS. 3, 4, and 5. After the bending, the shoulder portion 26 of the leads 17 is still relatively straight, parallel to the plane of the package faces 11, 12, and substantially perpendicular to the longitudinal axis of the package due to the support of the flat anvil face 24. The major elongated lead portion has been bent substantially vertically downward and normal to the plane of surface 12 by the completion of downward movement of the bending member 22 and the deviation from the true normal, highly exaggerated in FIG. 6 for illustrative purposes, is designed "alpha".

FIG. 7 shows a front end view of a two row dual-in-line lead bending apparatus 40 for simultaneously bending both sides or rows of leads 17 of a package 10 at once.

A semiconductor package 10 having a top surface 11, a bottom surface 12, a front end surface 13, a side edge 14, 15, top slant edges 16, and bottom slant edges 67. The leads extend substantially straight out from edges 14, 15 directly opposite one another. A first reciprocating bending punch 41 and a second bending punch 42 are disposed on opposite sides of the package 10. Bi-directional spring-wound reels or pulleys 45, 46 and 47, 48 are wound with a sheet or band 43, 44 of buffer material such as thin stainless steel or the like. A clamp 49 includes a spring 50 operatively coupled to the upper surface thereof and a surface 51 for operatively securing the opposite end of the spring 50 thereto. An anvil 88 includes a straight side 53, an anvil tip 54, an anvil slope 55, a straight body-receiving portion 56, a second anvil slope 57, a second anvil tip 58 and a straight anvil side 59.

Similarly, the clamp face includes corresponding matching straight clamp side 60, clamp tip 61, clamp slope 62, body-clamping portion 63, second clamp slope 64, second clamp tip 65 and second clamp side 66. The arrows 68, 69 indicate the direction the sheets or tapes 43, 44 move as they unwind from pulleys 45, 48 during the bending operation to prevent slippage as the sheets 43, 44 are pinched between the descending punches 41, 42 and the clamp-anvil combination putting drag on the tapes 43, 44 and on pulleys 46, 47 to prevent as much unreeling as from pulleys 45, 48. The reciprocating first bending punch 41 has a bending face 71 and a relatively straight bending surface 72 operatively disposed proximate to and substantially parallel to the first side 60 of the clamping device 49. Likewise, the second bending punch 42 has a second bending face 74 and a second bending surface 73 operatively disposed proximate to and substantially parallel to the second side 66 of clamping apparatus 49. At the beginning of the downward stroke, the separation between the surfaces 72, 73 and the corresponding clamping sides 60, 66, respectively, is approximately the thickness of the sheet or film 43, 44. The clamping distance of the lead 17 from the sides 14, 15 is equal to the width of the clamping tip 61 and corresponding anvil tip 54 and opposing side clamping tip 65 and anvil tip 58. Once the leads 17 are clamped between the tips 61, 54 and 65, 58, the clamping surface 63 will hold the package 10 and its upper surface 11 and the anvil surface 56 will hold the package 10 and its lower surface 12 for the actual lead bending operation. As the punches 41, 42 are disposed within the U-shaped sheets of web of thin steel 43, 44, the first U-shape is formed by the covering or sheet 43 between the pulley means 45, 46 with the closed end of the "U" operatively housing the punch tip or face 71 and the second U-shape is formed by the sheet 44 suspended between pulley means 47, 48 with the closed end of the "U" operatively housing the punch tip or face 74. As the encased punches 41, 42 descend further, the leads 17 are bent over the outside distal edge of the anvil tips 54, 58, the bending point 31 on the leads 17 corresponding to the point of contact of the leads 17 with the outer distal edges of anvil tips 54, 58. The leads 17 continue to bend as the punches 41, 42 move downward until the leads 17 contact the anvil sides 53, 59, the leads 17 being disposed between the sheet 43 proximate surface 72 and the anvil side 53 and between the sheet 44 proximate surface 73 and the anvil side 59. The distance between the inner punch surfaces 72, 73 and the outer anvil sides 53, 59 is approximately equal to the thickness of the sheet plus the thickness of the lead with adjustments in size to avoid strain or breakage or the like. As the lead is bent by the descending bending punches, the pulleys 45, 48 supply or lay out a snug never-ending carpet or protective layer of thin metal or the like to effectuate a touch-free, friction-free, multiple lead bending which virtually eliminates all scratches, marring, lead damage and the like.

The present invention also contemplates a method of bending leads in a multiple lead dual-in-line package having two rows of leads normally disposed substantially horizontally outward from the package and parallel to the faces thereof, said method comprising following steps:

Supporting the base or shoulder portion of a plurality of leads, preferably, one or two rows, proximate the end portion disposed in said package. At least one U-shaped channel is then formed from a thin sheet of metal having a length at least equal to the length of the plurality of leads to be bent. A bending member or punch is inserted into each U-shaped channel and vertically positioned over the outside edge of the supported portion of the lead. The punch within each U-shaped channel is then lowered so that the metal sheet engages said plurality of leads immediately adjacent the end of the supported portion thereof. Finally, the method includes bending the plurality of leads from the outside edge of the supported portion to a substantially nearly vertical position without the bending means or punch touching the leads or pins so that any scratches or other damage which would otherwise normally result to the leads occurs only on the inside surface of the U-shaped channels which serves to protect the leads. An additional step may be included in the bending process, wherein the thin metal sheet over the bending member at least partially slides off of the end of the member from the opposite side thereof and covers the work surface of the bending member without the thin sheet of metal sliding over the top surface of the leads and without scratching or damaging same. And lastly, the method contemplates bending one or more complete rows of leads at a time and bending one row on either side of the dual-in-line package simultaneously or alternatively, if desired.

With this detailed description of the specific method and apparatus used to illustrate the present invention and the operation thereof, it will be obvious to those skilled in the art that various modifications can be made without departing from the spirit and scope of the present invention which is limited only by the appended claims.

We claim:

1. An apparatus for bending the leads of a dual-in-line semiconductor package from a manufacturing position in which a plurality of leads are disposed on each of two sides of the package and extend outwardly from the side of the package substantially parallel to the plane of the top surface thereof to a use position in which said plurality of leads on each side of the package are operably disposed substantially nearly vertically downward and approximately nearly normal to the plane of the bottom face of said package for engaging pin sockets and the like for incorporation into an electrical circuit, said bending apparatus comprising:

an anvil means having a substantially flat distal end for operatively engaging and supporting that portion of the underside of said leads immediately adjacent at least one side of said package for supporting said leads to prevent bending and the like from immediately adjacent said package to a bending point on the opposite side of the anvil means.

a vertically movable punch means operably disposed over the top portion of all of the leads on at least one side of the package immediately adjacent to said anvil means for bending all of said plurality of leads on said at least one side of said package from the horizontal position to the substantially nearly vertical position; and a smooth thin band of metal operably disposed about the lead-engaging end portion of said punch means for creating a barrier between said punch means and said leads so that substantially all sliding, scoring, scratching, and the like, of said plurality of leads is eliminated as the punch slides across said band instead of across said leads and said band remains in contact with the top side of said leads during the entire bending operation.

2. The bending apparatus of claim 1 wherein said thin band of metal is formed in a generally U-shaped channel and the punch means is inserted into the open end thereof before contact is made with said plurality of leads during the bending operation to prevent damage thereto.

3. The bending apparatus of claim 2 wherein said smooth thin band of metal includes a steel barrier band having a thickness of approximately 0.002 inches.

4. A method of bending leads in a multiple lead dual-in-line package having two rows of leads, one on each side of said package, and wherein the said plurality of leads are originally substantially parallel to the surface of the package and ultimately substantially nearly vertical to the plane of the package for insertion into electrical sockets and the like, said method comprising the steps of:

supporting the base of at least one row of leads proximate the junction where one end of said leads is disposed in said package;

forming a U-shaped channel having a length at least equal to the length of said row of leads from a smooth thin sheet of metal;

inserting a vertically positionable bending member within said U-shaped channel;

lowering said bending member and said surrounding metal sheet to operatively engage the top portions of one row of leads immediately outside of said supported bases; and bending said row of leads from the horizontal position to the substantially nearly vertical position without said bending member physically touching said leads, so that any sliding of the bending member is over the surface of the steel sheet to substantially eliminate scratching and similar damage to said leads.

5. A method of bending leads in a multiple lead dual-in-line package having two rows of leads, one on each side of said package, and wherein the said plurality of leads are originally substantially parallel to the surface of the package and ultimately substantially nearly vertical to the plane of the package for insertion into electrical sockets and the like, said method comprising the steps of:
   supporting the base of at least one row of leads proximate the junction where one end of said leads is disposed in said package;
   forming a U-shaped channel having a length at least equal to the length of said row of leads from a smooth thin sheet of metal;
   inserting a vertically positionable bending member within said U-shaped channel;
   lowering said bending member and said surrounding metal sheet to operatively engage the top portions of one row of leads immediately outside of said supported bases; and
   bending said row of leads from the horizontal position to the substantially nearly vertical position without said bending member physically touching said leads, so that any sliding of the bending member is over the surface of the steel sheet to substantially eliminate scratching and similar damage to said leads, said bending including sliding said thin metal sheet with respect to said bending member so that said sheet, at least partially, slides off of the end of said bending member to provide new portions of said steel sheet between the top surface of said plurality of leads and the side of said bending member without sliding across the lead surfaces to further minimize scratching and similar damage to said leads.

6. In a multiple pin dual-in-line package including a generally rectangular package having substantially parallel top and bottom surfaces and having two rows, each of which includes a plurality of leads, one row being disposed on each longitudinal side of such rectangular package, and the leads being originally extended from the longitudinal side of the package approximately parallel to the top and bottom surfaces thereof, apparatus for bending at least one row of leads at a time substantially vertically downward from said parallel position to enable the leads to be inseted into socket holds and the like for incorporation into electrical circuits, said bending apparatus comprising:
   a stationary anvil means extending at least the entire length of a row of said leads and operably disposed under the leads and proximate the ends thereof sealed within said package for operatively supporting the same to prevent the leads from breaking at the point at which the leads enter and are sealed in the package and for preventing improper lead spacing for the sockets;
   a vertically movable bending member having its working end operably disposed along at least the entire length of the row of leads upward of said stationary anvil means and substantially immediately adjacent thereto; and
   a thin U-shaped sheet of buffer means operatively disposed about the working end portion of said bending member for protecting the top surface of said leads from scratching and the like when the bending member descends to bend the leads to a substantially nearly vertical position, said buffer means being operably disposed between said plurality of leads and said buffer means, such that any slipping by said bending member occurs overt the surface of said buffer means, thereby protecting said leads from damage.

7. The improved bending apparatus of claim 6 wherein the said buffer means minimizes sliding over the buffer surface of said leads by pulling new portions of the buffer means from the non-lead contacting side to the lead contacting side for laying down a substantially continuous buffer sheet over the length of the leads for protection during the entire bending operation.

8. The improved bending apparatus of claim 6 wherein said buffer means includes a thin sheet of steel.

9. The improved buffer means of claim 8 wherein the thickness of said thin sheet of steel is approximately 0.002 inches.

10. The improved bending apparatus of claim 6 further including:
   a second anvil means extending at least the entire length of a second row of said leads and operably disposed under the leads and proximate the ends of the lead portions sealed within said packages, for supporting the second row of said leads during the bending operation;
   a second bending member operably disposed above the second row of said leads substantially immediately adjacent to said second anvil means; and
   a second thin U-shaped buffer means operably disposed about the working end of said for second bending member for protecting the second row of said leads from scratching when the second bending member descends for performing the bending operation, therefore enabling both rows of said leads in a dual-in-line package to be bent at once.

11. An apparatus for bending both rows of leads of a rectangular dual-in-line semiconductor package simultaneously, comprising:
   a pair of bending means operably disposed on opposite sides of the package for bending opposite rows of leads, each of said bending means including a bending face;
   a pair of thin sheets of buffer means for protecting said opposite rows of leads from scratching, each of said buffer means being wrapped about at least a portion of one of said bending means including said bending faces; and
   anvil means for operatively positioning said package and including a pair of anvil tip means for supporting that portion of the leads immediately adjacent the edges of the package while permitting said bending means to bend that portion of the leads extending beyond said anvil tip means, said buffer means being the only contact between said leads and said bending means for preventing scratching, lead damage and the like.

12. The bending apparatus of claim 11 further including a clamping means for engaging the top of said package while said anvil means engages the bottom and a pair of clamping tips sized to fit said anvil tips for clampably positioning that portion of the leads which are not to be bent in place during the bending operation.

13. The bending apparatus of claim 12 wherein said clamping means includes a spring-biased return means operably engaging the top of said clamping means for lifting the clamping means off of the package whenever the bending means is raised past a predetermined point.

14. The bending apparatus of claim 11 further including first and second reeling means for selectively reeling and unreeling said pair of thin sheets of buffer means as said bending means is raised and lowered, each of said first and second reeling means operably engaging the ends of one of said pair of thin sheets of buffer means.

15. The bending apparatus of claim 14 wherein each of said first and second reeling means includes a pair of spring-biased pulleys, each of said pulleys operably engaging one end of one of said pair of thin sheets of buffer means.

16. The bending apparatus of claim 14 wherein each of said pair of thin sheets of buffer means includes a relatively thin band-like sheet of metal.

17. The bending apparatus of claim 16 wherein each of said sheets includes steel having a thickness of approximately 0.002 inches.

18. A method of bending leads in a dual-in-line semiconductor package comprising the steps of:
  forming a first pocket from a first relatively thin sheet of metal;
  inserting a first bending punch into the pocket;
  placing the package on an anvil;
  supporting a first portion of each of a first row of leads on a first anvil face extension;
  clamping to secure the package on the anvil and the first portion of each of the first row of leads between a first clamp face extension and the first anvil face extension during bending;
  lowering the sheet-covered first bending punch to contact the top surface of a second portion of each of the first row of leads to be bent so that the first bending punch slides over the first relatively thin sheet of metal in order to substantially eliminate damage to the first row of leads;
  bending the second portion of each of the first row of leads along one side of the anvil until each bent second portion makes an angle of approximately 90° with the plane of the package bottom;
  returning the first bending punch to a predetermined raised position; and
  releasing the clamping to free the package.

19. The method of claim 18 further including the steps of:
  forming a second pocket from a second relatively thin sheet of metal;
  inserting a second bending punch into the second pocket;
  supporting a first portion of each of a second row of leads on a second anvil face extension;
  clamping to secure the package on the anvil and the first portion of each of the second row of leads between a second clamp face extension and the second anvil face extension during bending and at the same time that the package is secured to the anvil and the first portion of each of the first row of leads is secured between the first clamp face extension and the first anvil face extension;
  simultaneously while lowering the sheet-covered first bending punch, lowering the sheet-covered second bending punch to contact the top surface of a second portion of each of the second row of leads to be bent so that the second bending punch slides over the second relatively thin sheet of metal in order to substantially eliminate damage to the second row of leads;
  simultaneously while bending the second portion of each of the first row of leads, bending the second portion of each of the second row of leads along another side of the anvil until each bent second portion makes an angle of approximately 90° with the plane of the package bottom; and
  simultaneously while returning the first bending punch, returning the second bending punch to a predetermined raised position.

20. A method of bending leads in a dual-in-line semiconductor package comprising the steps of:
  forming a pocket from a relatively thin sheet of metal;
  inserting a bending punch into the pocket;
  placing the package on an anvil;
  supporting a first portion of each of a row of leads on an anvil face extension;
  clamping to secure the package on the anvil and the first portion of each of the row of leads between a clamp face extension and the anvil face extension during bending;
  lowering the sheet-covered bending punch to contact the top surface of a second portion of each of the row of leads to be bent so that the bending punch slides over the relatively thin sheet of metal in order to substantially eliminate damage to the row of leads;
  bending the second portion of each of the row of leads along a side of the anvil until each bent second portion makes an angle of approximately 90° with the plane of the package bottom;
  returning the bending punch to a predetermined raised portion;
  unwinding and winding said thin sheet of metal from a pulley apparatus as said bending punch is lowered and raised; and
  releasing the clamping to free the package.

* * * * *